(12) United States Patent
Czubarow et al.

(10) Patent No.: US 7,906,373 B1
(45) Date of Patent: Mar. 15, 2011

(54) THERMALLY ENHANCED ELECTRICALLY INSULATIVE ADHESIVE PASTE

(76) Inventors: Pawel Czubarow, Wellesley, MA (US); Raymond L Dietz, Merrimac, MA (US); Maciej Patelka, Brighton, MA (US)

( * ) Notice: Subject to any disclaimer, the term of this patent is extended or adjusted under 35 U.S.C. 154(b) by 0 days.

(21) Appl. No.: 12/079,483

(22) Filed: Mar. 26, 2008

(51) Int. Cl.
*H01L 21/00* (2006.01)
*H01L 23/36* (2006.01)
*C08K 13/02* (2006.01)

(52) U.S. Cl. ............ 438/118; 257/713; 257/E21.505; 523/210

(58) Field of Classification Search .......... 438/118; 257/713; 523/210
See application file for complete search history.

(56) References Cited

U.S. PATENT DOCUMENTS

| | | | | |
|---|---|---|---|---|
| 5,204,399 A * | 4/1993 | Edelman | | 524/404 |
| 5,391,604 A * | 2/1995 | Dietz et al. | | 524/403 |
| 5,488,082 A * | 1/1996 | Dietz et al. | | 524/403 |
| 5,781,412 A * | 7/1998 | de Sorgo | | 361/704 |
| 5,852,092 A * | 12/1998 | Nguyen | | 524/404 |
| 6,117,930 A * | 9/2000 | Nguyen et al. | | 524/404 |
| 6,242,513 B1 * | 6/2001 | Zhou et al. | | 523/427 |
| 6,822,018 B2 * | 11/2004 | Chaudhuri et al. | | 523/210 |
| 2003/0158294 A1 * | 8/2003 | Chaudhuri et al. | | 523/205 |
| 2003/0203188 A1 * | 10/2003 | Bunyan | | 428/328 |
| 2004/0000712 A1 * | 1/2004 | Wilson et al. | | 257/712 |
| 2006/0121068 A1 * | 6/2006 | Sane et al. | | 424/400 |
| 2008/0111111 A1 * | 5/2008 | Fornes et al. | | 252/500 |

FOREIGN PATENT DOCUMENTS

WO    WO 2008/085999 A1 *  7/2008

* cited by examiner

*Primary Examiner* — Evan Pert

(57) ABSTRACT

Adhesive paste of polymer resin, fugitive liquid and particulate filler with round edges provides improved performance characteristics.

26 Claims, No Drawings

THERMALLY ENHANCED ELECTRICALLY INSULATIVE ADHESIVE PASTE

BACKGROUND OF THE INVENTION

The present invention relates to thermally enhanced adhesive pastes particularly well suited for bonding high density, microcircuit electronic components to substrates.

The attachment of high density, microcircuit components onto substrates, such as silicon dies onto ceramic sheet, has been an important aspect of the electronics industry for many years. Generally, it is known to use a die attach paste which is deposited between the die and substrate. Typically, the die attach paste includes a filler, an adhesive and a carrier. The filler is selected to impart to the finished bonding layer desired conductive, resistive or dielectric properties. The adhesive is chosen to create a strong bond between the die and substrate. The carrier maintains all the components in a fluid, uniform mixture, which allows the paste to be applied easily to the die-substrate interface. It also has suitable volatility to migrate from between the die and substrate following heat treatment of the assembly. After the paste is deposited and the die and substrate are assembled, the assembly is typically heated to fuse the adhesive and drive off the carrier. Upon cooling, the die is firmly attached to the substrate.

The power density of active components continues to rise, creating an increasing demand of higher thermally conductive adhesives to attach these components. These demands have previously been met by technologies described in the prior art, including U.S. Pat. Nos. 6,111,005 and 6,140,402. These patents describe a technology involving the use of powdered organic polymer resins, suspended in a non-solvent along with highly thermally conductive filler. The type of powdered resin was varied depending on the application. For large area component attachments where the Coefficient of Thermal Expansion (CTE) mismatch to the substrate was also large, low modulus thermoplastic polymers were incorporated to handle the shear stress generated at the bondline of the adhesive. For smaller area components where the expansion mismatch to the substrate was lower, thermoset or combinations of thermoplastic and thermoset polymer powders were employed in the adhesive composition with the filler. The use of the higher modulus polymers also increased the thermal conductivity.

U.S. Pat. No. 6,265,471 describes an even higher thermal conductivity technology where the highly conductive filler is suspended in a liquid epoxy resin which is dissolved in a fugitive solvent. This technology increased the thermal conductivity over the prior technology described in U.S. Pat. Nos. 6,111,005 and 6,140,402. Unfortunately, the elastic modulus of the thermosetting liquid resin system was relatively high when cured or cross-linked. Consequently, the application of this technology was limited to small area component attach and or substrates that were closely matched in CTE to the component, usually a semiconductor die. The prior art described in the technologies described above shows a linear relationship between the modulus and the thermal conductivity of the adhesive. Low modulus adhesives, described in U.S. Pat. Nos. 6,111,005 and 6,140,402, were lower in thermal conductivity, whereas the higher modulus adhesives described in U.S. Pat. No. 6,265,471 were higher in thermal conductivity. As higher function semiconductor devices grew in size and power, the need also grew for an adhesive with both high thermal conductivity and low modulus. Such adhesives were needed to absorb the bondline shear stresses caused by the thermal expansion mismatch between the die and the high expansion, high thermally conductive substrates.

One large application in the marketplace is the attachment of large area, flip chip microprocessor devices to a high expansion, high thermally conductive heat spreader. Both high conductivity and low modulus properties are needed for this application. Heretofore, the adhesives described in U.S. Pat. Nos. 6,111,005, 6,140,402 and 6,265,471 were used in these applications. However, the microprocessor devices increased in power density and thus the demand increased for adhesives having even better thermal properties with low elastic modulus.

SUMMARY OF THE INVENTION

The present invention provides die attach pastes which are strong, yet sufficiently elastic to bond large area silicon dies to more expandable substrates without inducing excessive stress yet provide significantly higher thermal properties and electrical insulation than the present art. The invention also provides an adhesive with significantly enhanced thermal properties for the attachment of smaller components where the modulus of the cured adhesive is higher and where electrical insulation is required. The invention further provides an adhesive paste which can be applied by equipment and processes presently used in the industry without major modifications and produce a bond line and when processed thereby. The invention also provides sufficient adhesion between the component and substrate to pass industry standards for adhesion. Furthermore, because the thermoplastic resins can be repeatedly melted and solidified, those constructions prepared using thermoplastic resins are reworkable and suitable for multi-chip module technology or for High Brightness Light Emitting Diode (HBLED) arrays.

Specifically, the present invention provides an adhesive paste consisting essentially of:

(A) about 2-30 weight percent organic polymer resin;
(B) up to about 30 weight percent fugitive liquid; and
(C) about 5-98 weight percent inorganic filler; wherein the filler is present in particulate form and at least about 80% of the filler particles are characterized by round edges and substantially free from flat surfaces and at least about 50% of the filler is mono dispersed conformable and a particle size of at least about 50 microns, and the balance of the filler has a particles of less than about 10 microns.

DETAILED DESCRIPTION OF THE INVENTION

A detailed description of the principal components of the adhesive pastes of the present invention are described in U.S. Pat. Nos. 6,111,005 and 6,265,471 both of which are hereby incorporated by reference. The key difference is the substitution of spherical shaped ceramic powders for the silver flakes in the adhesive composition, preferably in the presence of a sintering aid. The spherical ceramic powders produce a highly sintered, denser structure than the same paste with silver flakes. This produces an unexpected increase in thermal conductivity and decrease in thermal impedance. Furthermore, the present pastes provide increased adhesion, which allows a decrease in the resin content (higher filler-to-resin ratio) which further increases the thermal conductivity.

The ceramic filler used in the adhesive pastes of the present invention is present in particulate form. At least about 80% of the filler particles, and preferably substantially all of the filler particles, are characterized by round edges, and substantially free from flat surfaces. Substantially spherical particles are especially preferred. Representative of filler particles which can be use in the present invention are those available from Saint-Gobain boron nitride (BN) under the par # of PCTH3MHF. Another representative filler which can be used is spherical aluminum oxide (Al2O3) available from Denka Corp., Japan. As used herein, the term "conformable" refers to particles that compress under pressure or during curing.

The ceramic filler is preferably used in combination with at least one sintering aid, that is, any additive that enhances the sintering of the filler. Representative sintering aids include metal alkoxides, low melting point salts, organic inorganic hybrid composites. The sintering aid is generally present in a concentration of about from 0.1 to 0.5 weight percent of the cured materials.

The unexpected increase in thermal properties is not fully understood, but is believed to be due to the better packing and point contacts of the spheres as compared to the geometry of the flakes previously used in plastics of this type. Also believed to be significant is the presence of spherical conformable filler such as BN.

In the powder resin technology previously described, when the assembly is heated, the resin powder melts and coalesces with other particles and migrates toward the bondline interfaces. This melting of the powders leaves a void in the bondline, hereafter referred to "bond drop out" (BDO). In the current system, BDOs were not observed.

The sphere has the smallest surface area among all surfaces enclosing a given volume, and it encloses the largest volume among all closed surfaces with a given surface area. Thus, the number of contacts between spheres would be lower than a flake for a given volume of filler. Since the primary path of thermal conductivity is through the bulk of the filler, for the highest flow of heat, the number of particle contacts per unit volume of filler should be kept to a minimum and larger fillers are more beneficial in heat conduction. The packing density of the filler is the other key factor in determining the heat flow. This packing density can be enhanced by the particle size distribution of the spheres as illustrated in the examples to follow. Percent porosity is inversely proportional to thermal conductivity. Also in the case of large fillers and at least one fine one, the fine one becomes the interstacial filler of the large ones.

Other sphere-like shapes can also be use in the present invention. In mathematics, a spheroid is a quadratic surface in three dimensions obtained by rotating an ellipse about one of its principal axes. Thus, a sphere is a special case of the spheroid in which the generating ellipse is a circle.

Additives such as salts, low melting point glasses, mixed oxides, coating of particles with low mp. materials can also be used in the present invention. These components can further enhance thermal conductivity by allowing filler particles to "sinter" together in to a solid mass. These additives should serve as sintering aids for ceramic filler particles.

In the following examples and comparative examples, combinations of filler, resin and fugitive liquid were combined to form a paste. The preparation of the adhesive from its principal components, and its methods of application and use, take advantage of the various methods and employ equipment well known in the art. The principal components can be mixed in equipment known in the art for paste preparation. Details of this process are described in the prior art cited and referenced above.

The die attach adhesives of the present invention are typically used for attaching microcircuit electronic components to a substrate. In general, this comprises making an adhesive paste of the present invention; applying the paste to a surface of a substrate to form a bond line and placing the electronic component on the bond line so that the paste is between the electronic component and the substrate; followed by heating the assembly to a sufficiently high temperature for a sufficient time that the organic thermoplastic resin softens and becomes fluid, but does not degrade, and the liquid devolatilizes from the paste; followed by cooling the heat-treated assembly to a temperature below which the thermoplastic polymer becomes solid, whereby the microcircuit electronic component is bonded to the substrate by a void-free bond line. When thermoset resin is used, rather than as a particle, as part or all of the organic polymer, the processing temperature should be sufficiently high to crosslink the resin.

For purposes of demonstrating the invention, the pastes are deposited on a ceramic substrate before the die is placed on the wet adhesive. All curing was done at 200° C. peak for 30 minutes. After curing, a force perpendicular to the side of the die was applied until the die was sheared off the substrate. This force was recorded in psi as the adhesion value for the particular composition being tested. The thermal conductivity measurements were done by the known laser flash method on pellets which were ½ inch in size and about ⅛ inch thick. This measuring technique is more fully described in ASTM E 1461, "Standard Test Method for Thermal Diffusivity by the Flash Method."

As used herein, the expression "consists essentially of" means that the composition may include additional components other than the principal, named components, provided that the additional components are not present in an amount sufficient to detract from the operability of the present invention.

The present invention is now illustrated by examples of certain representative embodiments thereof, where all parts, proportions, and percentages are by weight unless otherwise indicated. The examples are intended to be illustrative only, and modifications and equivalents of the invention will be evident to those skilled in the art.

EXAMPLES 1-4 AND COMPARATIVE EXAMPLE A

| | Example | | | | |
|---|---|---|---|---|---|
| | A<br>H987 | 1<br>MP8-<br>109-3 | 2<br>MP8-<br>118-1 | 3<br>MP8-<br>114-2 | 4<br>MP8-<br>123-1<br>w/Lipotin |
| Filler | AlN/BN<br>non<br>spherical | Al2O3/<br>BN/ZnO<br>spherical | Al2O3/<br>BN/ZnO<br>spherical | Al2O3/<br>BN/ZnO<br>spherical | Al2O3/<br>BN/ZnO<br>spherical |
| Filler ratio | 50/50 | 35/55/10 | 35/55/10 | 35/55/10 | 35/55/10 |
| Filler amount | 50% | 52% | 75% | 82% | 82% |
| Resin | Liquid epoxy | Liquid epoxy | Liquid epoxy | Liquid epoxy | Liquid epoxy |
| BLT (mils) | 1.6 | 1.7 | 1.9 | 2.7 | 2.0 |
| Shear adhesion (psi) | 4178 | 5476 | 1061 | 511 | 737 |

Spherical filler enhances adhesion; increase in filler loading lowers adhesion but Lipotin increases adhesion.

EXAMPLES 5-8 AND COMPARATIVE EXAMPLE B

| | | | Example | | |
|---|---|---|---|---|---|
| | B<br>DM4140k-2 | 5<br>PCz1-61-2 | 6<br>MP8-109-2 | 7<br>MP8-109-1 | 8<br>MP8-118-2<br>Lipotin |
| Filler | AlN/BN<br>nonspherical | Al2O3/BN/<br>ZnO spherical | Al2O3/BN/<br>ZnO spherical | Al2O3/BN/<br>ZnO spherical | Al2O3/BN/<br>ZnO spherical |
| Filler ratio | 50/50 | 35/55/10 | 35/55/10 | 35/55/10 | 35/55/10 |
| Filler amount | 76% | 75% | 75% | 75% | 75% |
| Resin | 4709/0004<br>(6/4) | 4709 | 4709(−635)/<br>0004(6/4) | 4709(−635) | 4709(−635) |
| BLT (mils) | 1.6 | 4-7 | 2.7 | 2.5 | 2.3 |
| Adhesion | 811 | 930 | 811 | 254 | 821 |
| Rth | 0.776 | 0.962 | 0.645 | | 0.535 |
| K | 2 | 5.23 | | | |

Fine particle resin (−635 mesh) in which most particles are less then 20 micron in diameter lowers bond line thickness (BLT). Addition of thermoset (0004) in the thermoplastic enhances adhesion. Lipotin enhances adhesion and lowers Rth (interfacial thermal resistance).

| | Example | | | |
|---|---|---|---|---|
| | 9 | 10 | 11 | 12 |
| fillers | PCz1-69-1 | PCz1-63-3 | PCz1-45-1 | PCz1-61-2 |
| DAW3 (Al2O3) | 10.5 | 11 | 42.5 | 26 |
| PCTH3MHF (BN) | 52.5 | 56 | 42.5 | 41.5 |
| Kadox 930 (ZnO) | 7 | 8 | | 7.5 |
| 4709 | 30 | 25 | 25 | 25 |
| % porosity | 15 | 32.8 | 8.2 | 10.9 |
| k (W/mK) | 4.05 | 3.4 | 4.25 | 5.25 |
| Adhesion (psi) | 903 | 457 | 546 | 929 |

The above examples illustrate that reduction in porosity increases thermal conductivity even when % resin is increased. Also addition of ZnO increases thermal conductivity.

| | Example | | | | |
|---|---|---|---|---|---|
| | 13 | 14 | 15 | 16 | 17 |
| Filler | PCz1-65-2<br>75% filler | PCz1-60-2<br>75% | PCz1-66-3<br>75% filler | PCz1-61-1<br>75% | PCz1-61-2<br>75% |
| DAW 3 | 0.86 | 1.974 | | 2.713 | 1.726 |
| DAW 45 | 0.86 | | | | |
| DAW 10 | | | 1.726 | | |
| PCTH3MHF | 2.713 | 1.974 | 2.713 | 1.726 | 2.713 |
| Kadox 930 | 0.49 | 0.984 | 0.49 | 0.49 | 0.49 |
| 4709 | 1.64 | 1.64 | 1.64 | 1.64 | 1.64 |
| % porosity | 13.2 | 0.2 | 11.3 | 21.0 | 10.9 |
| k (W/mK) | 5.06 | 4.49 | 5.13 | 3.09 | 5.25 |
| Shear adhesion (psi) | 796 | 1025 | 933 | 1008 | 929 |

DAW 3 - 3 micron alumina;
DAW 10 - 10 micron alumina;
DAW 45 - 45 micron alumina;
PCTH3MHF - 3 mil BN.

The above examples show the importance of having BN at close to 50% of the total filler, also larger filler affords higher thermals.

Comparative Examples C-F

The following Comparative Examples illustrate that addition of interstitial filler with high conductivity such as AlN does not improve over all thermal conductivity of the composite.

| | Example | | | |
|---|---|---|---|---|
| | C | D | E | F |
| Filler | PCz1-48-3<br>85% filler | PCz1-36-1<br>(85% filler) | PCz1-38-3<br>(90% filler) | PCz1-49-2<br>85% filler |
| DAW 3 | 5.04 | 3.9 | 4.12 | |
| DAW 5 | | | | 5.04 |
| HC Starck A | 0.58 | 1.7 | 1.77 | 0.58 |
| 4709 | 0.98 | 0.98 | 0.65 | 0.98 |
| % porosity | 7.6 | 14.9 | 28.9 | 4.2 |
| k (W/mK) | 2.11 | 2.43 | 1.68 | 2.09 |
| Shear adhesion (psi) | 1393 | 1032 | 494 | 932 |

HC Starck A is AlN powder provided by HC Starck.

| Bulk thermal conductivity table | |
|---|---|
| Material | Thermal conductivity (W/mK) |
| Al2O3 | 20-30 |
| BN | 250-300 |
| AlN | 180-280 |
| ZnO | 40 |

Example 18 and Comparative Example G

The general procedure of Examples 1-4 was repeated, except that a loading of the filler in the powdered resin was 75% by weight. In Example 18, a filler characterized by round edges was used. In Comparative Example G, a flake filler was used. The resulting pastes were tested as before, and the results summarized in the following table.

|  | Example | |
| --- | --- | --- |
|  | 18 | G |
|  | Al2O3/BN/ZnO 25/55/20 | Al2O3/BN/AlN 25/55/20 |
| % porosity | 13.6 | 17.3 |
| k (W/mK) | 4.44 | 3.27 |

We claim:

1. An adhesive paste consisting essentially of:
   (A) about 2-30 weight percent organic polymer resin;
   (B) up to about 30 weight percent fugitive liquid; and
   (C) about 5-98 weight percent inorganic filler; wherein the filler is present in particulate form and at least about 80% of the filler particles are characterized by round edges and substantially free of flat surfaces and at least about 50% of the filler is mono dispersed, and has a particle size of at least about 50 microns and the balance of the filler has a particle size of less than about 10 microns.

2. An adhesive paste of claim 1 further characterized in that the inorganic filler has a tap density of about from 0.5 to 2.5 gm/cc.

3. An adhesive paste of claim 1 wherein the organic polymer resin is selected from thermoset and thermoplastic resins and mixtures thereof.

4. An adhesive paste of claim 1 wherein the organic polymer resin is in liquid or particulate form.

5. An adhesive paste of claim 3 wherein the organic polymer resin consists essentially of at least one thermoplastic resin.

6. An adhesive paste of claim 3 wherein the organic resin consists essentially of at least one thermoset resin.

7. An adhesive paste of claim 5 wherein the organic polymer resin is selected from at least one of thermoplastic polyester, copolyester, polyamide, copolyamide, polyurethane, polybutylene teraphthalate, polyolefin, acrylic, silicone, and liquid crystalline polymers.

8. An adhesive paste of claim 6 wherein the organic resin is selected from at least one of thermoset resins of epoxies, silicones, reactive polyesters, polyurethanes and polyimides.

9. An adhesive paste of claim 1 further comprising up to about 1.0 weight % sintering aid.

10. An adhesive paste of claim 9 wherein the sintering aid consists essentially of at least one metallo-organic compound.

11. An adhesive paste of claim 9 wherein the sintering aid consists essentially of at least one low melting point glass.

12. An adhesive paste of claim 9 wherein the sintering aid consists essentially of at least one low melting point inorganic salt.

13. An adhesive paste of claim 1 wherein the inorganic filler consists essentially of ceramic particles.

14. An adhesive paste of claim 13 wherein ceramic particles are at least one selected from boron nitride, aluminum oxide and zinc oxide.

15. An adhesive paste of claim 1 wherein the particle size of the ceramic filler is less than about 200 microns.

16. An adhesive paste of claim 1 wherein the shape of ceramic filler is selected from at least one of spheres, oblates, spheroids, oblong spheroids, and ellipsoids.

17. An adhesive paste of claim 1 wherein the larger particles of ceramic filler comprise boron nitride.

18. An adhesive paste of claim 1 wherein the inorganic filler comprises at least about 50% by weight, based on the total inorganic filler, of at least one material having a thermal conductivity greater than about 200 W/mK and at least about 10% by weight, based on the total inorganic filler, of at least one material having a thermal conductivity of less than about 40 W/mK.

19. An adhesive paste of claim 1 wherein the small particles of inorganic filler are selected from intersticial filler alumina and zinc oxide.

20. An adhesive paste of claim 1 wherein the fugitive liquid comprises an effective amount of at least one viscosity modifier.

21. An adhesive paste of claim 20 wherein the viscosity modifier comprises about from 0.05 to 5 volume % of the adhesive paste.

22. An adhesive paste of claim 20 wherein the viscosity modifier comprises at least one selected from styrene-butadiene-styrene, styrene-isoprene-styrene, styrene ethylene/butylene-styrene, styrene-ethylene/propylene-styrene, styrene-butadiene, styrene-butadiene-styrene, styrenic block copolymers, and polyisobutylene.

23. A process for assembling an electronic component on a substrate, comprising the steps of: (A) depositing an adhesive paste on a substrate, the paste consisting essentially of (i) about from 2 to 30 weight % of organic polymer resin; (ii) up to about 30 weight % fugitive liquid; and (iii) about from 5 to 98 weight % of inorganic filler; wherein the inorganic filler is present in particulate form and at least about 50% of the inorganic filler particles are characterized by round edges and substantially free of flat surfaces and at least about 50% of the filler is mono dispersed and at least about 50 microns in particle size and the balance are particles having a particle size of less than about 10 microns; (B) placing an electronic component on the substrate in contact with the adhesive paste; (C) heating the resulting assembly to a temperature above which the resin forms an adhesive bond between the two components; and (D) cooling the assembly to ambient temperature.

24. A process for assembling an electronic component on a substrate comprising the steps of: (A) depositing an adhesive according to claim 1 on an electronic component or substrate; (B) partially curing the adhesive on the component or substrate; (C) applying heat and pressure sufficient to bond the component to the substrate; and (D) cooling the assembly to ambient temperature.

25. An article made by the process of claim 23.

26. An article made by the process of claim 24.

* * * * *